(12) United States Patent
Ruoff et al.

(10) Patent No.: US 9,658,533 B2
(45) Date of Patent: May 23, 2017

(54) ARRANGEMENT OF A MIRROR (71) Applicant: Carl Zeiss SMT GmbH, Oberkochen (DE)

(72) Inventors: Johannes Ruoff, Aalen (DE); Heiko Feldmann, Germany (DE); Michael Layh, Altusried (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 430 days.

(21) Appl. No.: 14/269,276

(22) Filed: May 5, 2014

(65) Prior Publication Data
US 2014/0240686 A1 Aug. 28, 2014

Related U.S. Application Data (63) Continuation of application No. PCT/EP2012/072637, filed on Nov. 14, 2012.

(30) Foreign Application Priority Data

Nov. 15, 2011 (DE) .......................... 10 2011 086 345

(51) Int. Cl.
*G03B 27/54* (2006.01)
*G03F 7/20* (2006.01)
(Continued)

(52) U.S. Cl.
CPC ............ *G03F 7/7015* (2013.01); *B82Y 10/00* (2013.01); *G02B 5/0891* (2013.01); *G02B 5/09* (2013.01);
(Continued)

(58) Field of Classification Search
CPC ........ B82Y 10/00; G02B 5/0891; G02B 5/09; G21K 1/062; G21K 2201/067;
(Continued)

(56) References Cited

U.S. PATENT DOCUMENTS 6,859,515 B2    2/2005   Schultz et al.
2003/0026001 A1 2/2003   Heller et al.
(Continued)

FOREIGN PATENT DOCUMENTS

DE    10205425    5/2003
DE    10261137    7/2004
(Continued)

OTHER PUBLICATIONS

German Office Action, with translation thereof, for DE Appl No. 10 2011 086 345.1, dated Jul. 3, 2012.
(Continued)

*Primary Examiner* — Christina Riddle
(74) *Attorney, Agent, or Firm* — Fish & Richardson P.C.

(57) ABSTRACT

A mirror for EUV radiation comprises a total reflection surface, which has a first EUV-radiation-reflecting region and at least one second EUV-radiation-reflecting region, wherein the EUV-radiation-reflecting regions are structurally delimited from one another, wherein the first region comprises at least one first partial reflection surface which is surrounded along a circumference in each case by the at least one second region, and wherein the at least one second EUV-radiation-reflecting region comprises at least one second partial reflection surface which is embodied in a path-connected fashion and which is embodied in a continuous fashion.

19 Claims, 5 Drawing Sheets (51) Int. Cl.
  *G02B 5/09* (2006.01)
  *G21K 1/06* (2006.01)
  *G02B 5/08* (2006.01)
  *B82Y 10/00* (2011.01)
(52) U.S. Cl.
  CPC .......... *G03F 7/702* (2013.01); *G03F 7/70075* (2013.01); *G03F 7/70316* (2013.01); *G21K 1/062* (2013.01); *G21K 2201/067* (2013.01)
(58) Field of Classification Search
  CPC .............. G03F 7/70075; G03F 7/7015; G03F 7/70166; G03F 7/702; G03F 7/70233; G03F 7/70308; G03F 7/70316
  USPC ......... 355/30, 52, 53, 55, 60, 66, 67–71, 77; 250/492.1, 492.2, 492.22, 492.23, 493.1, 250/503.1; 359/850, 851
  See application file for complete search history.

(56) References Cited

U.S. PATENT DOCUMENTS

| | | | |
|---|---|---|---|
| 2004/0218289 | A1 | 11/2004 | Kino et al. |
| 2005/0030653 | A1 | 2/2005 | Holderer et al. |
| 2005/0111067 | A1* | 5/2005 | Seifert .................. B82Y 10/00 359/216.1 |
| 2007/0223112 | A1* | 9/2007 | Mann .................... B82Y 10/00 359/726 |
| 2007/0273853 | A1* | 11/2007 | Bleeker ................. G03B 27/54 355/46 |
| 2008/0123807 | A1 | 5/2008 | Warm et al. |
| 2010/0149504 | A1* | 6/2010 | Deguenther ........ G03F 7/70566 355/66 |
| 2012/0019799 | A1 | 1/2012 | Fiolka et al. |
| 2012/0044474 | A1 | 2/2012 | Hauf et al. |
| 2012/0224186 | A1* | 9/2012 | Hetzler ................ G02B 13/143 356/508 |
| 2012/0293785 | A1 | 11/2012 | Kirch et al. |
| 2013/0021592 | A1 | 1/2013 | Hempelmann et al. |
| 2013/0100429 | A1 | 4/2013 | Fiolka et al. |
| 2013/0188163 | A1 | 7/2013 | Ruoff et al. |
| 2015/0160561 | A1* | 6/2015 | Saenger .............. G03F 7/70066 355/67 |

FOREIGN PATENT DOCUMENTS

| | | |
|---|---|---|
| DE | 10329141 | 2/2005 |
| DE | 102007034447 | 1/2008 |
| DE | 102008009600 | 8/2009 |
| DE | 102009034502 | 1/2011 |
| DE | 102010038748 | 3/2011 |
| DE | 102010001336 B3 | 7/2011 |
| EP | 1 927 892 | 6/2008 |
| JP | 2003-149418 A | 5/2003 |
| JP | 2008-135743 A | 6/2008 |
| JP | 2012-522257 A | 9/2012 |
| JP | 2013-514639 A | 4/2013 |
| JP | 2013-535115 A | 9/2013 |
| JP | 2013-540350 A | 10/2015 |
| JP | 2015-534110 A | 11/2015 |
| WO | WO 2004/057400 | 7/2004 |
| WO | WO 2009/024164 | 2/2009 |

OTHER PUBLICATIONS

Chinese office action with English translation with respect to parallel Chinese patent application No. 2012 8006 4971.1, dated Nov. 27, 2015.
International Search Report for corresponding PCT Appl No. PCT/EP2012/072637, dated Jun. 21, 2013.
Japanese office action, with English translation thereof, for corresponding JP Appl No. 2014- 541649, dated Aug. 31, 2016.

* cited by examiner

ARRANGEMENT OF A MIRROR

CROSS-REFERENCE TO RELATED APPLICATIONS

The present application is a continuation of, and claims benefit under 35 USC 120 to, international application PCT/EP2012/072637, filed Nov. 14, 2012, which claims benefit under 35 USC 119 of German Application No. 10 2011 086 345.1, filed Nov. 15, 2011. The content of both international application PCT/EP2012/072637 and German Patent Application DE 10 2011 086 345.1 is incorporated by reference herein.

The invention relates to the arrangement of a mirror for EUV radiation in a projection exposure apparatus. The invention furthermore relates to a mirror for EUV radiation. Furthermore, the application relates to an illumination optical unit and a projection optical unit and an optical system for an EUV projection exposure apparatus and an EUV projection exposure apparatus. Finally, the invention relates to a method for producing a micro- or nanostructured component and a component produced according to the method.

Mirrors for EUV radiation and an EUV projection exposure apparatus are known from EP 1 927 892 A1.

It is an object of the present invention to improve the imaging quality of a projection exposure apparatus. This object is achieved via an arrangement of a mirror for EUV radiation in a microlithographic projection exposure apparatus which includes an illumination optical unit for illuminating an object field with EUV radiation and a projection optical unit for projecting the object field into an image field. The EUV radiation has a specific beam path in the illumination optical unit and in the projection optical unit. The mirror has a mirror body having at least one first EUV-radiation-reflecting region and at least one second EUV-radiation-reflecting region. The at least one first region is arranged in the beam path of the illumination optical unit, and the at least one second region is arranged in the beam path of the projection optical unit. The heart of the invention consists in arranging a mirror in a projection exposure apparatus in such a way that a first radiation-reflecting region of the mirror is arranged in the beam path of the illumination optical unit and a second radiation-reflecting region is arranged in the beam path of the projection optical unit. Consequently, considered as a whole, the mirror is both a part of the illumination optical unit and a part of the projection optical unit. In particular the imaging quality of a high-aperture projection exposure apparatus can be improved by such an arrangement of the mirror. The object-side numerical aperture of the projection exposure apparatus can be in particular at least 0.4, in particular at least 0.5, in particular at least 0.6, in particular at least 0.7.

The second region forms in particular a first mirror or a second mirror in the beam path of the projection optical unit.

In particular the first region comprises a multiplicity of partial reflection surfaces embodied in a disconnected fashion. The partial reflection surfaces form facets, in particular pupil facets of the illumination optical unit.

The mirror is preferably embodied according to the following description.

A further object of the invention is to develop a mirror for EUV radiation in such a way that it is possible to improve the optical quality of an EUV projection exposure apparatus.

This object is achieved a mirror for EUV radiation having a total reflection surface, which has a first EUV-radiation-reflecting region and at least one second EUV-radiation-reflecting region. The EUV-radiation-reflecting regions are structurally delimited from one another. The first region includes a plurality of first partial reflection surfaces. The at least one second EUV-radiation-reflecting region comprises at least one second partial reflection surface which is embodied in a path-connected fashion and which is embodied in a continuous fashion. The first partial reflection surfaces in each case along a circumference are surrounded by the second partial reflection surface at least in portions. According to the invention it has been recognized that the beam path in a projection exposure apparatus can be improved by virtue of a single mirror having a plurality of different radiation-reflecting regions having different functions. It has been recognized, in particular, that the reflectivity of a reticle serving as a lithography mask falls greatly starting from a specific angle of incidence of the EUV radiation used for illumination. On the other hand, in the case of illumination of the reticle with small angles of incidence, in particular in the case of perpendicular illumination of the reticle, that is to say in the case of a course of the chief ray of the illumination optical unit parallel to the optical axis and a perpendicular orientation of the reticle with respect thereto, obscurations of the beam path in the illumination and/or projection optical unit occur in a manner governed by structural engineering. Therefore, the invention provides for the total reflection surface of a mirror to be divided into a first and at least one second radiation-reflecting region, wherein the regions are structurally delimited from one another, and wherein the first region comprises at least one first partial reflection surface which is surrounded by the at least one second region, and wherein the at least one second radiation-reflecting region comprises at least one second partial reflection surface which is embodied in a path-connected fashion and which is embodied in a continuous fashion, in particular in a manner free of diffraction edges. The second region can also be embodied in a continuous fashion overall, that is to say apart from the margin in a manner free of diffraction edges. The partial reflection surfaces of the first region can in particular each be surrounded completely by the at least one second region. In other words, they can be arranged in an insular fashion in the second region. In this case, the second region is in particular not embodied in a simply connected fashion. Such an embodiment of the mirror makes it possible as it were to embody two different mirrors in a single component.

The at least one first partial reflection surface is arranged relative to the second partial reflection surface in particular in each case in such a way that the circumference thereof in each case forms an edge. The first partial reflection surface can be arranged offset relative to the second partial reflection surface in particular in each case in the direction of a surface normal. The total reflection surface can be embodied in each case in a discontinuous fashion in particular in the region of the circumference. This can be achieved, for example, by virtue of the first partial reflection surface being applied to the second partial reflection surface in each case as a separate element or being arranged in cutouts in the second partial reflection surface. This facilitates the structural construction of the mirror.

Preferably, the first region comprises a plurality of separate partial reflection surfaces. The number of first partial reflection surfaces can be at least ten, in particular at least 30, in particular at least 100, in particular at least 300, in particular at least 500, in particular at least 1000. The first partial reflection surfaces can form facet elements, in particular pupil facets, for forming a faceted illumination optical unit. Independent illumination channels of an illumination optical unit can be formed with the aid of such facet elements. The channels can be combined with a predefined illumination angle distribution for different illumination settings for illuminating a reticle.

In accordance with one particularly advantageous embodiment, the first region has a spatial extent which becomes located within the second region to a proportion of at least 80% in the case of a point mirroring at a central axis of the mirror. Preferably, the first region has a spatial extent which becomes located within the second region to a proportion of at least 90%, in particular at least 95%, preferably completely, in the case of a point mirroring at a central axis of the mirror. In other words, for each first partial reflection surface there exists in each case a conjugate surface in the second region in such a way that the zero order of diffraction of the radiation reflected by the reticle is incident from the first partial reflection surface for the most part, in particular completely, on a second partial reflection surface in the second radiation-reflecting region.

With knowledge of the structures of the reticles usually used, via a targeted arrangement of the first and second partial reflection surfaces it is possible to predetermine which orders of diffraction of the reflected light contribute to the projection of the reticles into the image field. The arrangement and embodiment of the first and second partial reflection surfaces can be chosen in particular in such a way that, for specific reticles, at least or exclusively the zero order of diffraction and/or the $1^{st}/-1^{st}$ order of diffraction and/or higher orders of diffraction of the reflected radiation contribute to the projection of the reticles into the image field.

For the structural construction of the mirror it can be advantageous for the second partial reflection surface to be embodied as a reflective coating on a main substrate and the at least one first partial reflection surface to be embodied in each case as a coating on at least one further auxiliary substrate. In this case, the auxiliary substrate can be arranged on the main substrate or in openings in the main substrate.

Further objects of the invention are to improve an illumination optical unit, a projection optical unit and an optical system for an EUV projection exposure apparatus, and an EUV projection exposure apparatus.

These objects are achieved via: an illumination optical unit for illuminating an object field with EUV radiation with a mirror described above; a projection optical unit for imaging an object field into an image field with an arrangement of a mirror described above; such a projection optical unit in which the mirror is arranged near the pupil; an optical system for an EUV projection exposure apparatus including an illumination optical unit for illuminating an object field with EUV radiation, wherein the illumination optical unit has at least one pupil facet mirror, and wherein the EUV radiation has at least one specific beam path in the illumination optical unit for generating a specific illumination setting, and a projection optical unit for imaging the object field into an image field, and also including an arrangement of a mirror as described above; and an EUV projection exposure apparatus including an EUV radiation source and such an optical system. The advantages correspond to those described above.

Further objects of the invention are to specify a method for producing a component using the projection exposure apparatus, and a component produced by the method.

These objects are achieved according to the invention via: a production method for producing a micro- or nanostructured component which includes providing a reticle, providing a wafer having a light-sensitive coating, projecting at least one portion of the reticle onto the wafer with the aid of a projection exposure apparatus as described above, and developing the exposed light-sensitive coating on the wafer; and a component produced according to such a method.

The advantages of these subjects correspond to those which have already been discussed above.

Further details and particulars of the invention will become apparent from the description of a number of exemplary embodiments with reference to the drawings, in which.

Figure 1:
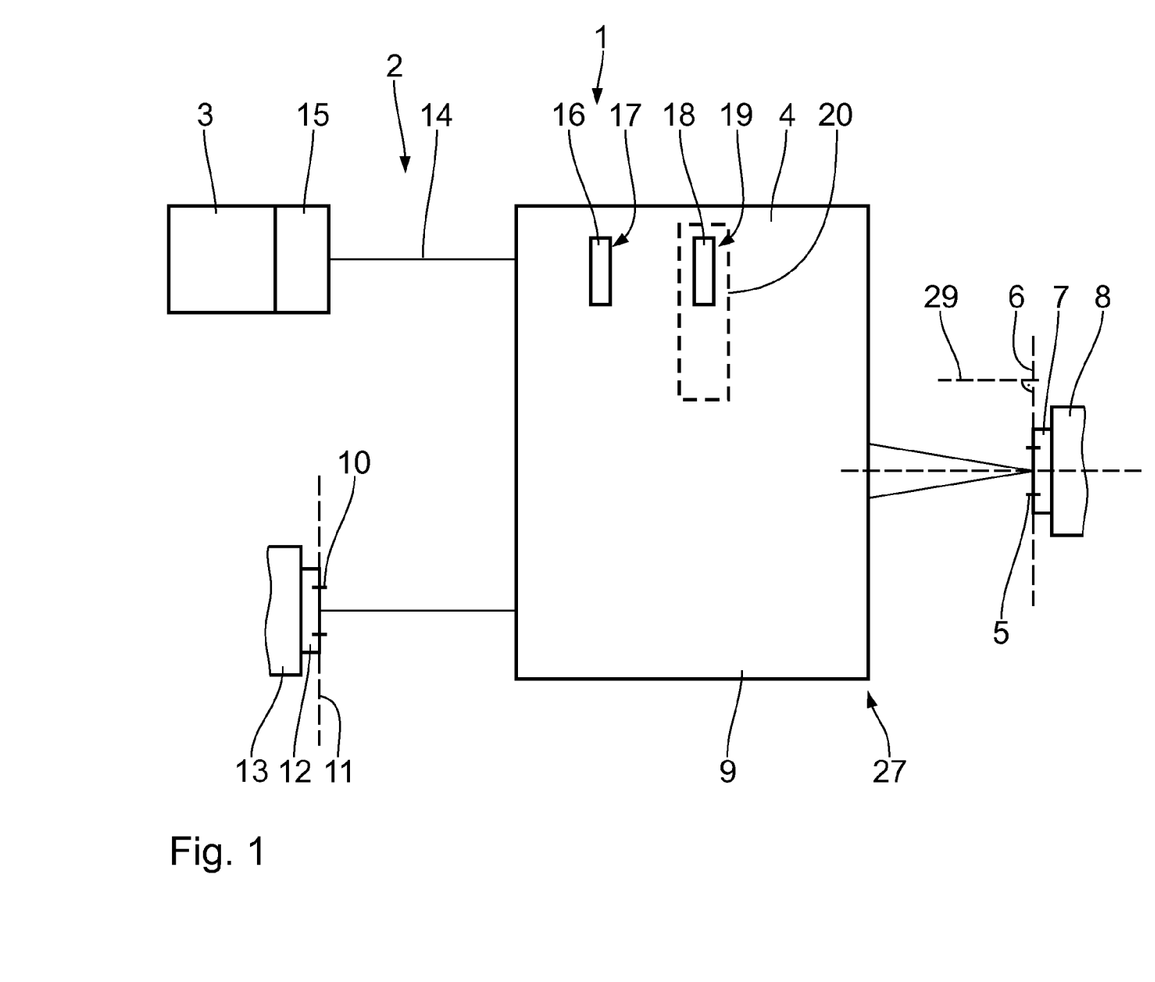
FIG. 1 shows a schematic illustration of the components of an EUV projection exposure apparatus for EUV lithography.

FIG. 1 schematically shows, in a meridional section, the components of a microlithographic projection exposure apparatus 1. An illumination system 2 of the projection exposure apparatus 1 comprises, alongside a radiation source 3, an illumination optical unit 4 for exposing an object field 5 in an object plane 6. In this case, a reticle 7 arranged in the object field 5 is exposed, the reticle being held by a reticle holder 8, which is merely illustrated as an excerpt.

A projection optical unit 9 serves for imaging the object field 5 into an image field 10 in an image plane 11. A structure on the reticle 7 is imaged onto a light-sensitive layer of a wafer 12 arranged in the region of the image field 10 in the image plane 11, the wafer being held by a wafer holder 13, which is likewise illustrated schematically.

The radiation source 3 is an EUV radiation source which emits EUV radiation 14. The wavelength of the emitted used radiation of the EUV radiation source 3 is in the range of 5 nm to 30 nm. Other wavelengths which are used in lithography and for which suitable light sources are available are also possible. The radiation source 3 can be a plasma source, for example a DPP source or an LPP source. A radiation source based on a synchrotron can also be used as radiation source 3. Information about such a radiation source can be found by the person skilled in the art for example in U.S. Pat. No. 6,859,515 B2. A collector 15 is provided for focusing the EUV radiation 14 from the EUV radiation source 3.

The EUV radiation 14 is also designated as illumination light or as imaging light.

The illumination optical unit 4 comprises a field facet mirror 16 having a multiplicity of field facets 17. The field facet mirror 16 is arranged in a plane of the illumination optical unit 4 which is optically conjugate with respect to the object plane 6. The EUV radiation 14 is reflected from the field facet mirror 16 to a pupil facet mirror 18 of the illumination optical unit 4. The pupil facet mirror 18 has a multiplicity of pupil facets 19. With the aid of the pupil facet mirror 18, the field facets 17 of the field facet mirror 16 are imaged into the object field 5.

For each field facet 17 on the field facet mirror 16 there is at least one associated pupil facet 19 on the pupil facet mirror 18. A light channel is formed between a respective field facet 17 and a respective pupil facet 19. The facets 17, 19 of at least one of the facet mirrors 16, 18 can be embodied as switchable. They can be arranged in particular in a tiltable fashion on the facet mirror 16, 18. In this case, it is possible to embody only a portion, for example at most 30%, at most 50% or at most 70% of the facets 17, 19 in a tiltable fashion. Provision can also be made for embodying all of the facets 17, 19 in a tiltable fashion. The switchable facets 17, 19 are the field facets 17, in particular. By tilting the field facets 17, it is possible to vary the assignment thereof to the respective pupil facets 19 and thus the formation of the light channels. A specific assignment of the field facets 17 to the respective pupil facets 19 is also designated as an illumination setting. For further details of the facet mirrors 16, 18 having tiltable facets 17, 19, reference should be made to DE 10 2008 009 600 A1.

For further details of the illumination optical unit 4, reference should likewise be made to DE 10 2008 009 600 A1.

The beam path of the EUV radiation 14 in the illumination optical unit 4 and the projection optical unit 9 and, in particular, the structural arrangement of the field facet mirror 16 and of the pupil facet mirror 18 cannot be gathered from FIG. 1.

The reticle holder 8 is displaceable in a controlled manner such that during projection exposure the reticle 7 can be displaced in a displacement direction in the object plane 6. Correspondingly, the wafer holder 13 is displaceable in a controlled manner such that the wafer 12 is displaceable in a displacement direction in the image plane 11. As a result, the reticle 7 and the wafer 12 can be scanned by the object field 5, on the one hand, and by the image field 10, on the other hand. The displacement direction is also designated hereinafter as scanning direction. The displacement of the reticle 7 and of the wafer 12 in the scanning direction can preferably be effected synchronously with one another.

The projection optical unit 9 comprises a multiplicity of projection mirrors $M_i$, which are not illustrated in FIG. 1. The projection optical unit 9 comprises in particular at least three, in particular at least five, projection mirrors M1 to M5. It can have in particular at least six, seven or eight projection mirrors M1 to M8.

During the use of the projection exposure apparatus 1, provision is made of the reticle 7 and the wafer 12 bearing a coating that is light-sensitive to the illumination light 14. At least one portion of the reticle 7 is subsequently projected onto the wafer 12 with the aid of the projection exposure apparatus 1. In this case, the reticle is illuminated with EUV radiation 14 in such a way that the chief ray (CRA, Chief Ray Angle) of the EUV radiation 14 impinges on the reticle 7 at an angle of incidence of at most 6°, in particular at most 3°, in particular at most 1°, in particular 0°. In this case, the angle of incidence is defined as the angle between the chief ray of the beam of rays serving for illuminating the reticle 7 and a normal 29 to the reticle 7. The angle of incidence of the chief ray is in particular less than the object-side numerical aperture, CRA<arcsin (NAO).

During the projection of the reticle 7 on the wafer 12, the reticle holder 8 and/or the wafer holder 13 can be displaced in a direction parallel to the object plane 6 and/or parallel to the image plane. The displacement of the reticle 7 and of the wafer 12 can preferably be effected synchronously with one another.

Finally, the light-sensitive layer on the wafer 12 that has been exposed with the illumination light is developed. A micro- or nanostructured component, in particular a semi-conductor chip, is produced in this way.

An optical system 27 according to the invention comprises the illumination optical unit 4 and the projection optical unit 9.

The optical system 27 according to the invention has a mirror 20, which will be described in greater detail below.

Figure 2:
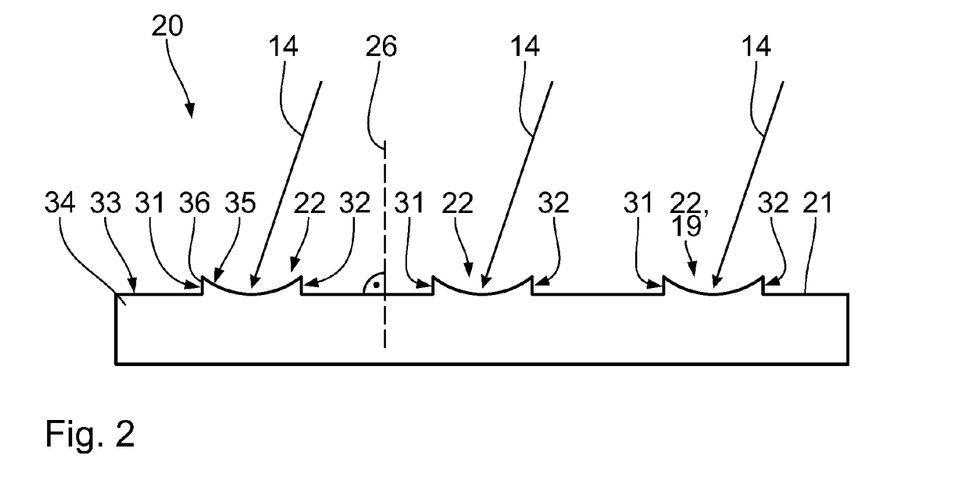
FIG. 2 shows a schematic illustration of a mirror in accordance with a first exemplary embodiment.

The mirror 20 has a mirror body 21 having a total reflection surface 24. The total reflection surface 24 is also designated as mirror surface for simplification. It is not necessarily embodied in a flat fashion, however, in particular it is not necessarily embodied in a continuous fashion. It has in particular a first EUV-radiation-reflecting region. The first EUV-radiation-reflecting region comprises a multiplicity of first partial reflection surfaces 22. The first partial reflection surfaces 22 can be embodied in a mutually disconnected fashion. The first EUV-radiation-reflecting region is therefore not simply connected. However, the individual first partial reflection surfaces 22 can each by themselves be simply connected.

The number of first partial reflection surfaces 22 can be in particular at least ten, in particular at least 30, in particular at least 100. The first partial reflection surfaces 22 are preferably arranged in a manner distributed uniformly over the total reflection surface 24. They are arranged in particular in such a way that their geometric centroid coincides with a central axis 25 of the mirror 20. They can be arranged on one or a plurality of circles around the central axis 25.

The first partial reflection surfaces 22 are embodied in each case in a round fashion, in particular in a circular fashion. They have linear dimensions in the range of 1 mm to 20 mm, in particular in the range of 5 mm to 15 mm. In principle, it is also possible to embody the first partial reflection surfaces 22 in an angular fashion, in particular in a polygonal fashion, for example in a square or hexagonal fashion.

The first partial reflection surfaces 22 can form the pupil facets 19. In this case, the first radiation-reflecting region of the mirror 20 forms the pupil facet mirror 18. The latter is therefore integrated into the mirror 20 and in particular does not form a structurally independent element.

In addition, the mirror 20 has a second EUV-radiation-reflecting region. The second EUV-radiation-reflecting region comprises a second partial reflection surface 23. In the exemplary embodiment illustrated, the union of the first and second partial reflection surfaces 22, 23 forms the total reflection surface 24. The second EUV-radiation-reflecting region comprises in particular exactly one second partial reflection surface 23. The second partial reflection surface 23 thus forms the second EUV-radiation-reflecting region. In principle, it is also conceivable to embody the mirror 20 with even further regions with separate partial reflection surfaces.

The first partial reflection surfaces 22 in each case along their circumference 31 are surrounded completely by the second region, in particular by the second partial reflection surface 23. They are surrounded by the second partial reflection surface 23 at least in portions along their circumference 31, that is to say that they adjoin the second partial reflection surface 23 at least in portions along their circumference 31.

The first partial reflection surfaces 22 are arranged relative to the second partial reflection surface 23 in each case in such a way that the circumference 31 in each case forms an edge. In particular a step 32 can be formed in the region of the circumference 31. In other words, the first partial reflection surfaces 22 can be arranged offset relative to the second partial reflection surface 23 in the direction of a surface normal 26 of the mirror 22. To put it another way, the total reflection surface 24 is embodied in each case in a discontinuous fashion in the region of the circumference 31.

Moreover, the second partial reflection surface 23 in each case and preferably the entire second region is embodied in a continuous fashion. It is embodied in particular apart from its margin in a manner free of diffraction edges. It is embodied in a path-connected fashion. It is possible, in particular, to embody the second EUV-radiation-reflecting region in a path-connected fashion.

The first partial reflection surfaces 22 are arranged on the total reflection surface 24 in each case in such a way that their spatial extent becomes located completely within the second region, that is to say in the region of the second partial reflection surface 23, in the case of a point mirroring at a central axis 25 of the mirror 20. For clarification in FIG. 4 the corresponding partial surfaces are illustrated with a dashed border and provided with the reference sign 22*. Hereinafter they are also designated as conjugate surfaces 22* relative to the respective first partial reflection surfaces 22. In general, the number of first partial reflection surfaces 22 is significantly greater than that illustrated in FIG. 4.

Figure 4:
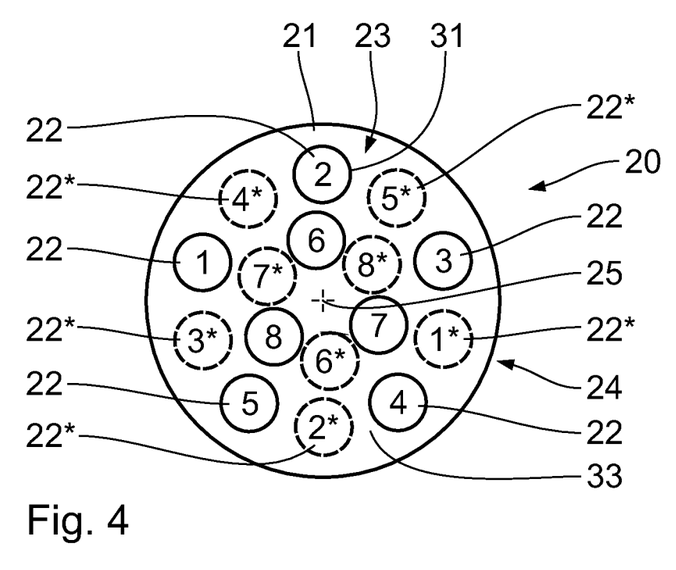
FIG. 4 shows schematic illustrations of different arrangements of the radiation-reflecting regions on the mirror.

The first region, that is to say the totality of the first partial reflection surfaces 22, thus has a spatial extent which becomes located completely within the second region, that is to say in the region of the second partial reflection surface 23, in the case of a point mirroring at the central axis 25 of the mirror 20.

The second partial reflection surface 23 is embodied as a reflective coating 33 on a main substrate 34. The coating 33 comprises in particular a multiplicity of alternating layers of silicon and molybdenum. For details of such a layer system, reference should be made to DE 10 2010 001 336 B3, for example. Correspondingly, the first partial reflection surfaces 22 are embodied in each case as a coating 35 on a further auxiliary substrate 36 separate from the main substrate 34. In terms of its basic construction, the coating 35 for the first partial reflection surfaces 22 corresponds to the coating 33 for the second partial reflection surface 23. However, the layers of the coating 35 of the first partial reflection surfaces 22 can have different layer thicknesses from those of the coating 33 of the second partial reflection surface 23. For details of the coating 35, reference should again be made to DE 10 2010 001 336 B3. In the case of the exemplary embodiment illustrated in FIG. 2, each of the first partial reflection surfaces 22 is formed by a separate auxiliary substrate 36 with the coating 35. In the case of the exemplary embodiment illustrated in FIG. 2, the auxiliary substrates 36 of the first partial reflection surfaces 22 are in each case applied to the main substrate 34. They can be, in particular, adhesively bonded, wrung or bonded onto the main substrate 34. Such an arrangement of the auxiliary substrates 36 on the main substrate 34 is very stable.

Figure 3:
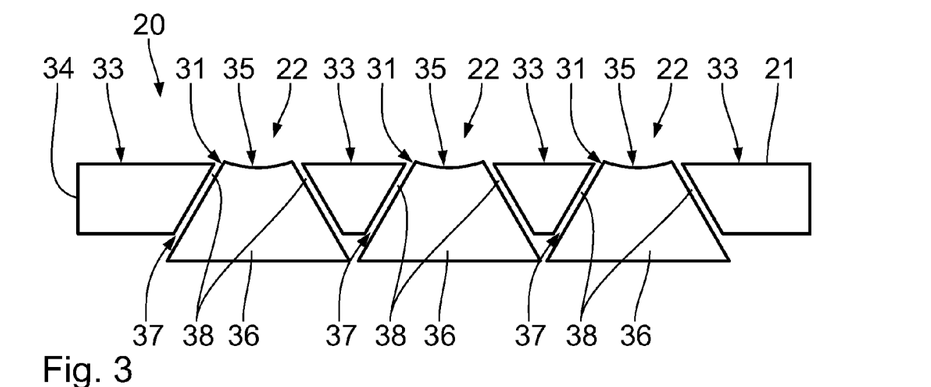
FIG. 3 shows a schematic illustration of a mirror in accordance with a second exemplary embodiment.

In the case of the exemplary embodiment illustrated in FIG. 3, the first partial reflection surfaces 22 are arranged in cutouts 37 in the main substrate 34. In this embodiment it is possible to embody all first partial reflection surfaces 22 on a single auxiliary substrate 36. In this embodiment, the auxiliary substrate 36 is introduced from the rear side of the mirror 20 into the cutouts 37 penetrating completely through the main substrate 34 of the mirror 20. This leads to a thermal and mechanical decoupling of the auxiliary substrate 36 from the main substrate 34 and thus from the first partial reflection surfaces 22 and the second partial reflection surface 23. In this embodiment, therefore, a small gap 38 is in each case formed in the region of the circumference 31 of the first partial reflection surfaces 22. The gap 38 preferably has a free width of at most 1 cm, in particular at most 3 mm, in particular at most 1 mm. Despite the gap 38, in this exemplary embodiment, too, the first partial reflection surfaces 22 and the second partial reflection surface 23 are designated as adjoining one another in the region of the circumference 31. The first partial reflection surfaces 22 are in any case each surrounded by the second partial reflection surface 23. The invention provides for arranging the mirror 20 in the beam path of the projection exposure apparatus 1 in such a way that the first region, that is to say the first partial reflection surfaces 22, are arranged in the beam path of the illumination optical unit 4 and the second region, that is to say the second partial reflection surface 23, is arranged in the beam path of the projection optical unit 9. The mirror 20 is therefore part of both the illumination optical unit 4 and the projection optical unit 9.

Figure 5:
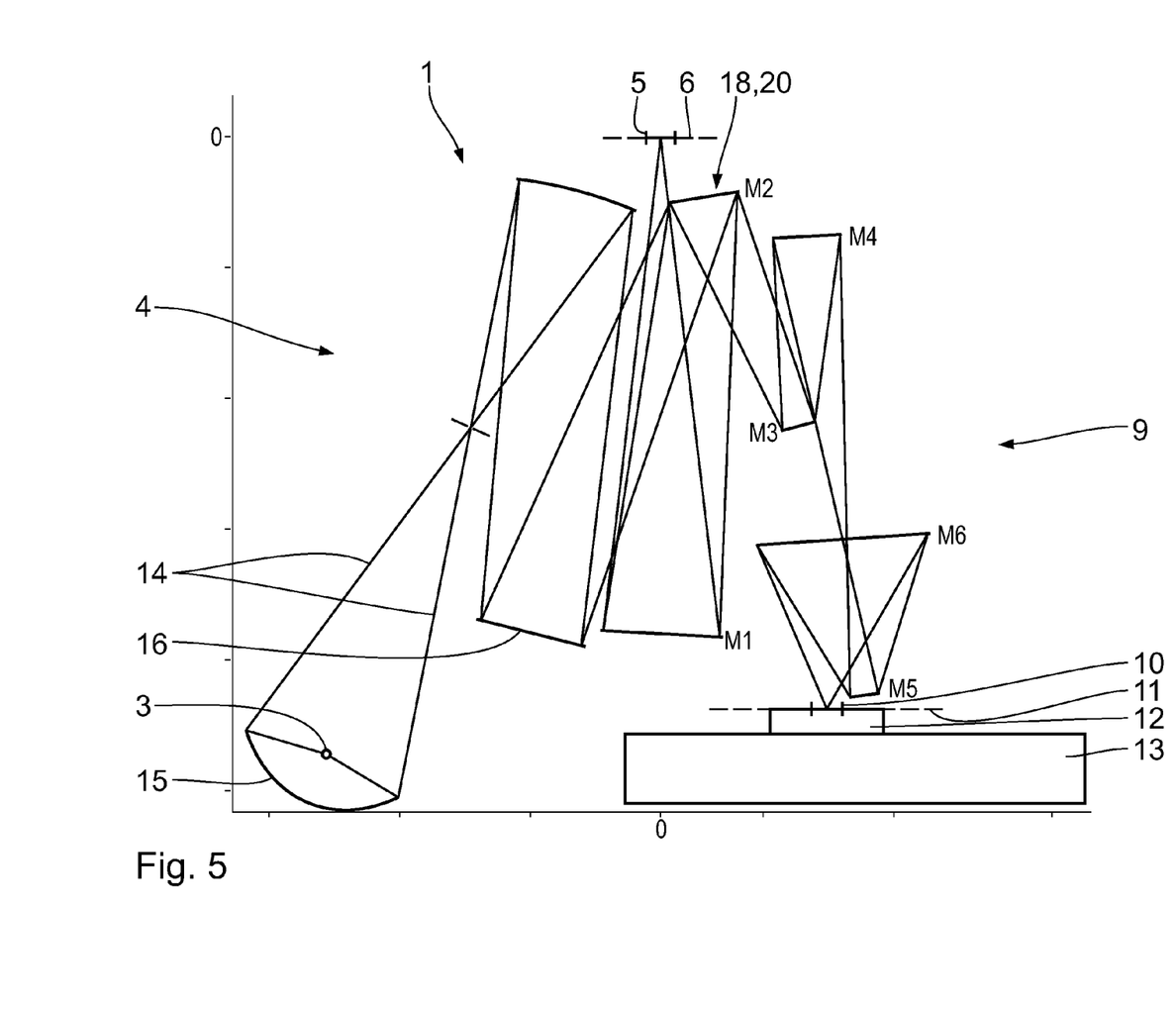
FIG. 5 shows schematic illustrations of the arrangement of the mirror in the beam path of a projection exposure apparatus in accordance with a first exemplary embodiment.
Figure 6:
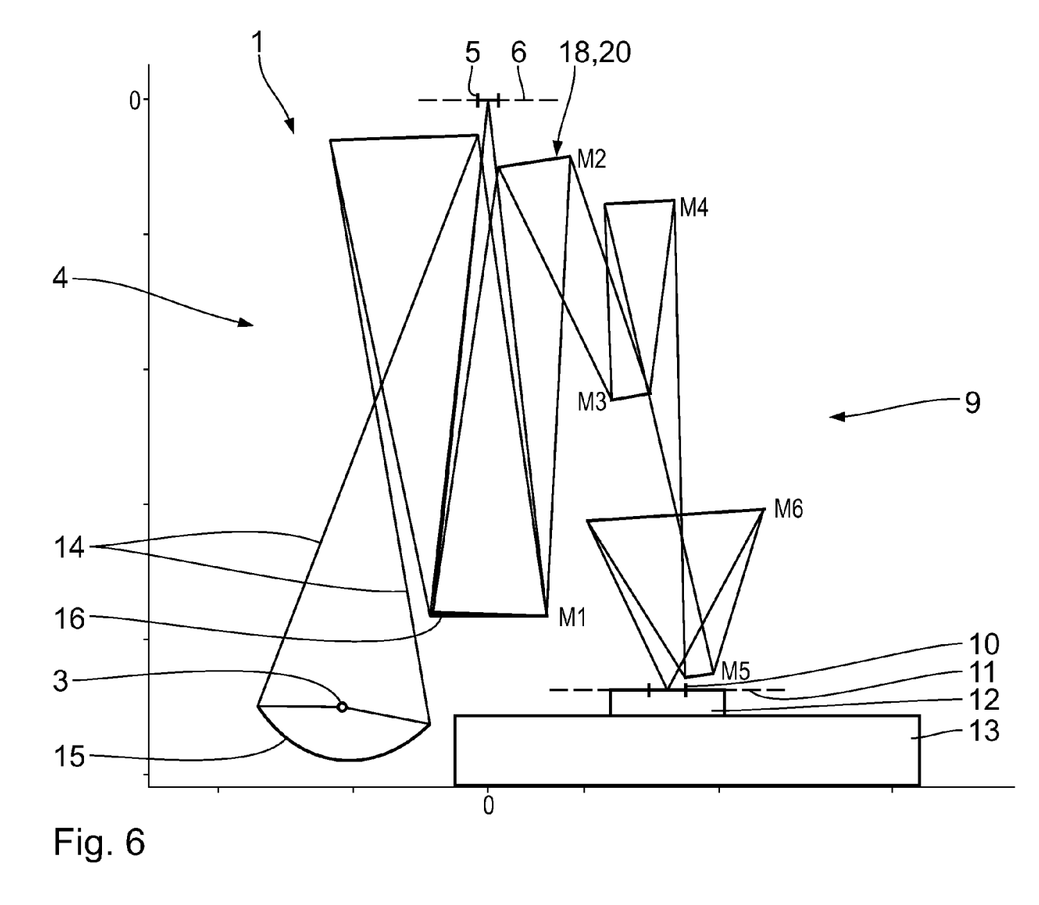
FIG. 6 shows schematic illustrations of the arrangement of the mirror in the beam path of a projection exposure apparatus in accordance with a second exemplary embodiment.

Possible arrangements of the mirror 20 in the beam path of the projection exposure apparatus 1 are illustrated by way of example in FIGS. 5 and 6. In both embodiments, the projection optical unit 9 has six mirrors M1 to M6, the numbering of the mirrors M1 to M6 corresponding to their order in the beam path of the projection optical unit 9. In the case of the embodiment illustrated in FIG. 5, the mirror 20, in particular the second region, that is to say the second partial reflection surface 23 thereof, forms the mirror M2 of the projection optical unit 9.

In the case of the exemplary embodiment illustrated in FIG. 6, the mirror 20, in particular the second region, that is to say the second partial reflection surface 23, forms the mirror M1 of the projection optical unit 9. This leads to lower radiation losses and thus to a higher transmission of the projection optical unit 9.

It can be advantageous, in particular, to arrange the mirror 20 near the pupil. An arrangement of a mirror M near the pupil is present if the following condition is met:

$$P(M)=D(SA)/(D(SA)+D(CR))\geq 0.5.$$

In this case, $D(SA)$ is the subaperture diameter of a beam emerging from an object field point at the location of the mirror M and $D(CR)$ is the maximum distance of chief rays of an effective object field, imaged by the imaging optical unit, measured in a reference plane of the optical system, on the surface of the mirror M. The reference plane can be a plane of symmetry or a meridional plane of the imaging optical unit. The definition of the parameter $P(M)$ corresponds to that specified in WO 2009/024 164 A1. $P(M)=0$ holds true in a field plane. $P(M)=1$ holds true in a pupil plane.

An arrangement of the mirror 20 near the pupil reduces the dependence of the imaging properties on the position in the object field 5. In particular a field-independent imaging can be achieved.

As an alternative to the use in a projection exposure apparatus 1, the mirror 20 according to the invention can also be used in an inspection device in particular for inspecting reflective lithography masks or for inspecting exposed wafer substrates. In this case, the image field 10 of the projection optical unit 9 constitutes an inspection object field of the inspection device.

In a further embodiment, the mirror 20 comprises a multiplicity of adjustable partial mirror elements. The partial mirror elements are so-called micromirrors, in particular.

The mirror 20 forms a microelectromechanical system (MEMS), in particular. In this case, the first partial reflection surfaces 22 and/or the second partial reflection surface 23 can be formed by adjustable micromirrors. For structural details of such micromirrors and the driving thereof, reference should be made to DE 10 2009 034 502 A1.

The invention claimed is:

1. An apparatus, comprising:
an illumination optical unit configured to illuminate an object field with EUV radiation;
a projection optical unit configured to project the object field into an image field; and
a mirror comprising a first EUV radiation reflecting region and a second EUV radiation reflecting region which is different from the first EUV radiation reflecting region,
wherein:
the apparatus is configured so that, during use of the apparatus: a) the EUV radiation has a beam path in the illumination optical unit; and b) the EUV radiation has a beam path in the projection optical unit;
the first EUV radiation reflecting region is in the beam path of the illumination optical unit;
the second EUV radiation reflecting region is in the beam path of the projection optical unit; and
the apparatus is a microlithographic projection exposure apparatus.

2. The apparatus of claim 1, wherein the second EUV radiation reflecting region is a first mirror after the object field along the beam path of the projection optical unit.

3. The apparatus of claim 2, wherein the first EUV radiation reflecting region comprises a multiplicity of disconnected, partial reflection surfaces.

4. The apparatus of claim 1, wherein the second EUV radiation reflecting region is a second mirror after the object field along the beam path of the projection optical unit.

5. The apparatus of claim 4, wherein the first EUV radiation reflecting region comprises a multiplicity of disconnected, partial reflection surfaces.

6. The apparatus of claim 1, wherein the first EUV radiation reflecting region comprises a multiplicity of disconnected, partial reflection surfaces.

7. The apparatus of claim 1, wherein:
the first EUV radiation reflecting region comprises a plurality of partial reflection surfaces;
the second EUV radiation reflecting region comprises a partial reflection surface which is continuous and embodied in a path-connected fashion; and
each partial reflection surface of the first EUV radiation reflecting region is surrounded along its circumference by the partial reflection surface of the second EUV radiation reflecting region.

8. The apparatus of claim 1, wherein the illumination optical unit further comprises a field facet mirror.

9. The apparatus of claim 1, further comprising a source for the EUV radiation.

10. A mirror, comprising:
a first EUV radiation reflecting region; and
a second EUV radiation reflecting region,
wherein:
the first and second EUV radiation reflecting regions are structurally delimited from each other;
the first EUV radiation reflecting region comprises a plurality of partial reflection surfaces;
the second EUV radiation reflecting region comprises a partial reflection surface which is continuous and embodied in a path-connected fashion; and
each partial reflection surface of the first EUV radiation reflecting region is surrounded along its circumference by the partial reflection surface of the second EUV radiation reflecting region.

11. The mirror of claim 10, wherein each partial reflection surface of the first EUV radiation reflecting region is completely surrounded along its circumference by the partial reflection surface of the second EUV radiation reflecting region.

12. The mirror of claim 10, wherein there is a point mirroring at a central axis of the mirror, and 80% of a spatial extent of the first EUV radiation reflecting region is located within the second EUV radiation reflecting region.

13. The mirror of claim 10, wherein the partial reflection surface of the second EUV radiation reflecting region comprises a reflective coating supported by a first substrate, and each partial reflection surface of the first EUV radiation reflecting region comprises a reflective coating supported by at least one second substrate different from the first substrate.

14. An optical unit configured to illuminate an object field, the optical unit comprising:
a mirror according to claim 10,
wherein the optical unit is a microlithographic illumination optical unit.

15. An optical unit configured to image an object field into an image field, the optical unit comprising:
a mirror according to claim 10,
wherein the optical unit is a microlithographic projection optical unit.

16. The projection optical unit of claim 15, wherein:
the mirror has a surface;

$$D(SA)/(D(SA)+D(CR))\geq 0.5;$$

$D(SA)$ is a subaperture diameter of a beam emerging from an object field point at the location of the mirror; and
$D(CR)$ is a maximum distance of chief rays of an effective object field, imaged by the projection optical unit, at the surface of the mirror.

17. A method, comprising:
using the microlithographic projection exposure apparatus of claim 16 in a process which comprises:
using the illumination optical unit to illuminate a reticle in the object field; and
using the projection optical unit to project at least a portion of the reticle onto a light-sensitive material in the image field.

18. An apparatus, comprising:
an illumination optical unit configured to illuminate an object field;
a projection optical unit configured to image the object field into an image field; and
a mirror according to claim 10.

19. The apparatus of claim 18, wherein, during use of the apparatus, EUV radiation passes through the illumination optical unit along a first path, EUV radiation passes through the projection optical unit along a second path different from the first path, the first path intersects the first EUV radiation reflecting region, and the second path intersects the second EUV radiation reflecting region.

* * * * *